United States Patent
Chou

[11] Patent Number: 5,909,394
[45] Date of Patent: Jun. 1, 1999

[54] PRECHARGE CIRCUIT FOR PREVENTING INVALID OUTPUT PULSES CAUSED BY CURRENT SENSING CIRCUITS IN FLASH MEMORY DEVICES

[75] Inventor: Yung-Fa Chou, Hsinchu, Taiwan

[73] Assignee: Taiwan Semiconductor Manufacturing Co., LTD., Hsinchu, Taiwan

[21] Appl. No.: 09/138,559

[22] Filed: Aug. 24, 1998

[51] Int. Cl.$^6$ ............................... G11C 16/06; G11C 7/00
[52] U.S. Cl. ................ 365/185.21; 365/185.25; 365/203; 327/51
[58] Field of Search ............ 365/185.21, 185.23, 365/185.25, 185.33, 203, 230.06; 327/51

[56] References Cited

U.S. PATENT DOCUMENTS

| | | | |
|---|---|---|---|
| 5,056,063 | 10/1991 | Santin et al. | 365/185.21 |
| 5,386,158 | 1/1995 | Wang | 327/51 |
| 5,566,111 | 10/1996 | Choi | 365/185.21 |
| 5,572,465 | 11/1996 | Bashir | 365/185.21 |
| 5,751,632 | 5/1998 | Choi et al. | 365/185.21 |

*Primary Examiner*—Trong Phan
*Attorney, Agent, or Firm*—Harold L. Novick; Nath & Associates

[57] ABSTRACT

The present invention discloses a precharge circuit for preventing undesired output pulses caused by the current sensing circuit of the flash memory devices. The access time of the read-cycle also can be decreased after the undesired output pulses are completely removed. Basically, the circuit disclosed by the invention encompasses the current mirror and the cell array as conventionally; a control circuit, a voltage detector and a precharge circuit to remove the undesired output pulses. The control circuit couples with the current mirror, the voltage detector, and the precharge circuit. The current mirror is used to generate output waveform. The precharge circuit couples with the cell array with a bit line, and pre-charges the voltage level of the bit line to a predetermined expected value. The control circuit controls the precharge circuit to precharge the bit line when the read-cycle starts. Whole the current sensing circuit keeps disable until the voltage level of the bit line rises to an expected value. The output signal is then generated according to the logic-state of selected memory cell of the flash memory. The invalid logic 1 will never appear whatever the logic-state of the selected memory cell is.

20 Claims, 4 Drawing Sheets

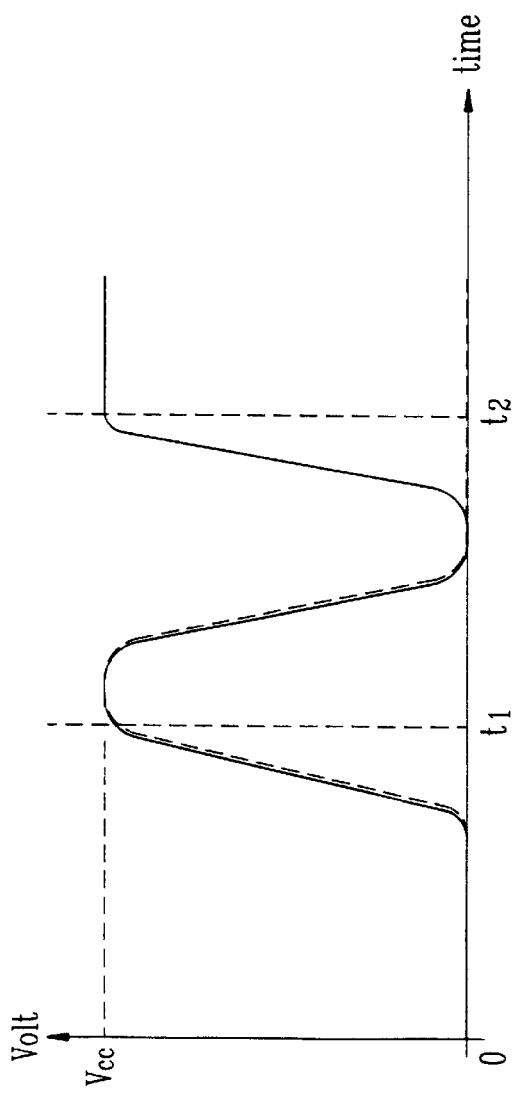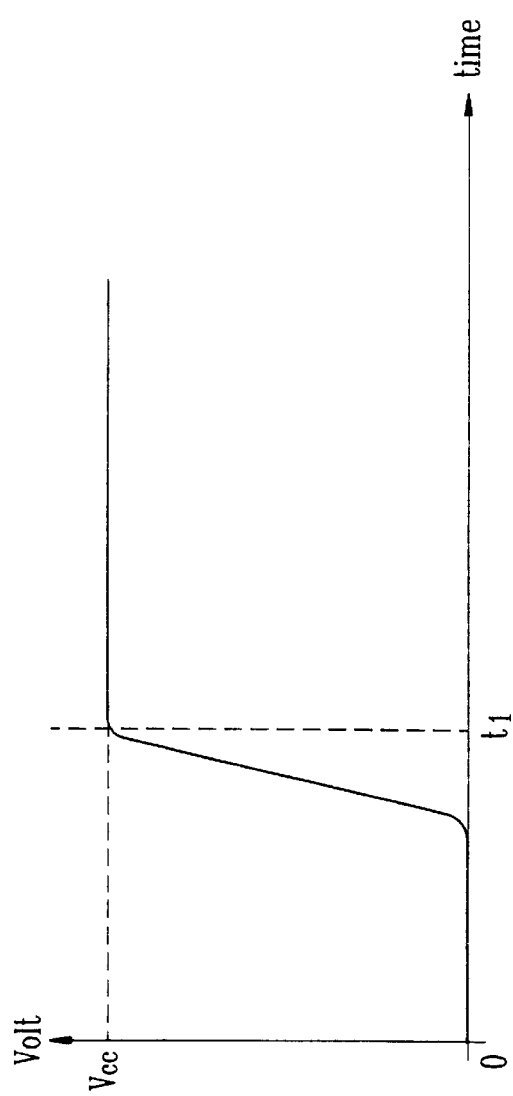

PRECHARGE CIRCUIT FOR PREVENTING INVALID OUTPUT PULSES CAUSED BY CURRENT SENSING CIRCUITS IN FLASH MEMORY DEVICES

BACKGROUND OF THE INVENTION

1. Field of the Invention

The present invention relates to a circuit for preventing invalid output in a flash memory device, and more particularly, to a precharge circuit for preventing invalid output pulses caused by current sensing circuits in the flash memory devices.

2. Description of the Prior Art

Nowadays, many kinds of electrical products are invented and manufactured each day, and these new products usually need high processing speed than before. A key point for upgrading the processing speed is to effectively enhance the access time from data storage, such as decrease the transmission delay of the volatile or non-volatile memories. A major disadvantage of the volatile memories, such as DRAM (Dynamic Random Access Memory) or SRAM (Static Random Access Memory) is that they lose all their stored memory if power is turned off. However, it is important for some memory systems to retain their data even the power is off. Non-volatile memories, such as ROM (Read Only Memory), PROM (Programmable ROM), EPROM (Erasable PROM), EEPROM (Electrical EPROM), and flash memory are another class of memories that are developed to prevent programmed data from being lost. Typically, the manufacturer or user can program their non-volatile memory based on requirements, and the programmed data can be stored for a long time interval.

Flash memory is a relative new generation of the non-volatile memories that is derived by a technology similar but advanced to the EPROM device. All the skilled persons know that many advantages offer by the flash memory. For example, the flash memory is electrically re-programmable a few times ranging up to many thousand times. Furthermore, the flash memory can be packaged in the low cost plastic package, and the flash memory also can be used in high-density sockets that will be basic requirements in the future.

Current sensing circuits are commonly used for generating outputs signals when accessing data from the flash memories. However, invalid output pulses are usually detected in the read-cycle of the flash memories. Referring to FIGS. 1A and 1B, which respectively illustrates the functional and detail diagrams of a conventional current sensing circuit (please refer to the U.S. Pat. No. 5,386,158). In FIG. 1A, a sensing enable signal (SE) input to a current mirror 11 is used to retrieve the programmed data ($S_o$) which is programmed in a cell array 12 beforehand. Typically, the memory cell that is programmed to conduct current indicates logic 1 (usually is designated to be $V_{cc}$), and the memory cell that is programmed to prevent from conducting current is used to indicate logic 0 (usually equals to the ground's voltage level). When the read-cycle starts, a current generated by the current mirror 11 will detect the selected memory cell of the cell array 12. Therefore, the logic-state of the selected memory cell is determined by the current through a bit line (BL).

FIG. 1B represents a detail circuit structure of the current sensing circuit in FIG. 1. A reference voltage ($V_{ref}$) connects with the gate of the NMOS transistor 105 is used to sink a reference current ($I_{ref}$). Please note that the BL is reset to logic 0 before each read-cycle starts. Accordingly, when the BL is reset and the SE is 0, a PMOS transistor 101 will be conducted but an NMOS transistor 104 is turned off. The voltage level of the node B is thus risen to logic 1, and both of the PMOS transistors 102 and 103 that consists the current mirror 11 are not turned on. When the read-cycle starts, SE will rise to logic 1 to conduct the NMOS transistor 104. The NMOS transistor 104 is treated as a current switch to conduct the current from the current mirror 11 to the selected memory cell through BL. The PMOS transistor 102 and 103 (i.e. current mirror 11) will turn on and the voltage level of the node B will fall. As noted, the BL is detected when the read-cycle starts at the same time. If the selected memory cell is not conductive, there will be no current flowing through the PMOS transistor 102 to the NMOS transistor 104. Because the $I_{ref}$ indicates a constant current, the voltage level of the node A will be pulled down to logic 0. Thus, the output $S_o$ is also logic 0.

On the other hand, when the selected memory cell is conductive, there will be a significant current flowing through the PMOS transistor 102 and the NMOS transistor 104 into the selected memory cell. Because both the PMOS transistors 102 and 103 are conductive, a current $I_c$ with the same amount flowing through the PMOS transistor 102 will also appears at the node A. Because the current $I_c$ is designated to be much larger than $I_{ref}$, the voltage level of the node A will be pulled up to be logic 1, and $S_o$ is also logic 1 after amplifying by two series inverters 106 and 107.

Although the conventional current sensing circuit can be employed to access programmed data from the cell array 11, however, a longer access time is required for waiting the accessed voltage levels to be stable. Referring to FIG. 3A, which illustrates a waveform diagram representative of an output waveform derived from the circuit in FIG. 1B. An invalid logic 1 is caused by a current directed into the cell array 12 when BL being set. Therefore, each time when the read-cycle begins, a current flowing to BL will induce the current mirror to generate an undesired current to charge the node A, and the invalid logic 1 is thus obtained at $S_o$. A curve indicated by dot-lines is used to represent the output waveform at $S_o$ when the selected memory cell is not conductive. Another curve that is indicated by solid-lines is used to describe the output waveform $S_o$ when the selected memory is conductive. It is clearly that $S_o$ is unstable until $t_2$, and there is a significantly time delay (from $t_1$ to $t_2$) for waiting. Typically, $t_1$ is about 10 nano seconds, and $t_2$ is about 20 nano seconds. Sometimes, although $S_o$ outputs a stable logic 1 before $t_1$, however, the invalid logic 1 is clearly an error when logic 0 is programmed. A need has therefore been arisen to disclose a circuit, in which the access time delay of the current sensing circuit here can be significantly reduced for achieving the requirement of high operation speed.

SUMMARY OF THE INVENTION

Accordingly, the present invention discloses a precharge circuit for preventing invalid output pulses caused by the current sensing circuit of the flash memory devices.

Basically, the circuit disclosed by the invention encompasses the current mirror, the cell array, and the voltage detector as conventionally, a control circuit and a precharge circuit to remove the undesired output pulses. The control circuit couples with the current mirror, the voltage detector, and the precharge circuit. The precharge circuit couples with the cell array with a bit line, and pre-charges the voltage level of the bit line to a predetermined expected value. The control circuit controls the precharge circuit to precharge the bit line when the read-cycle starts. Whole the current sensing circuit keeps disable until the voltage level of the bit line rises to an expected value. The output signal is then generated according to the logic-state of selected memory cell of the flash memory. The invalid logic 1 will never appear whatever the logic-state of the selected memory cell is.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3A depicts a diagram representative of the output waveform when the circuit of the FIG. 1B is applied; and FIG. 3B describes a diagram representative of the output waveform when the circuit of the invention is used.

DESCRIPTION OF THE PREFERRED EMBODIMENT

Figure 2A:
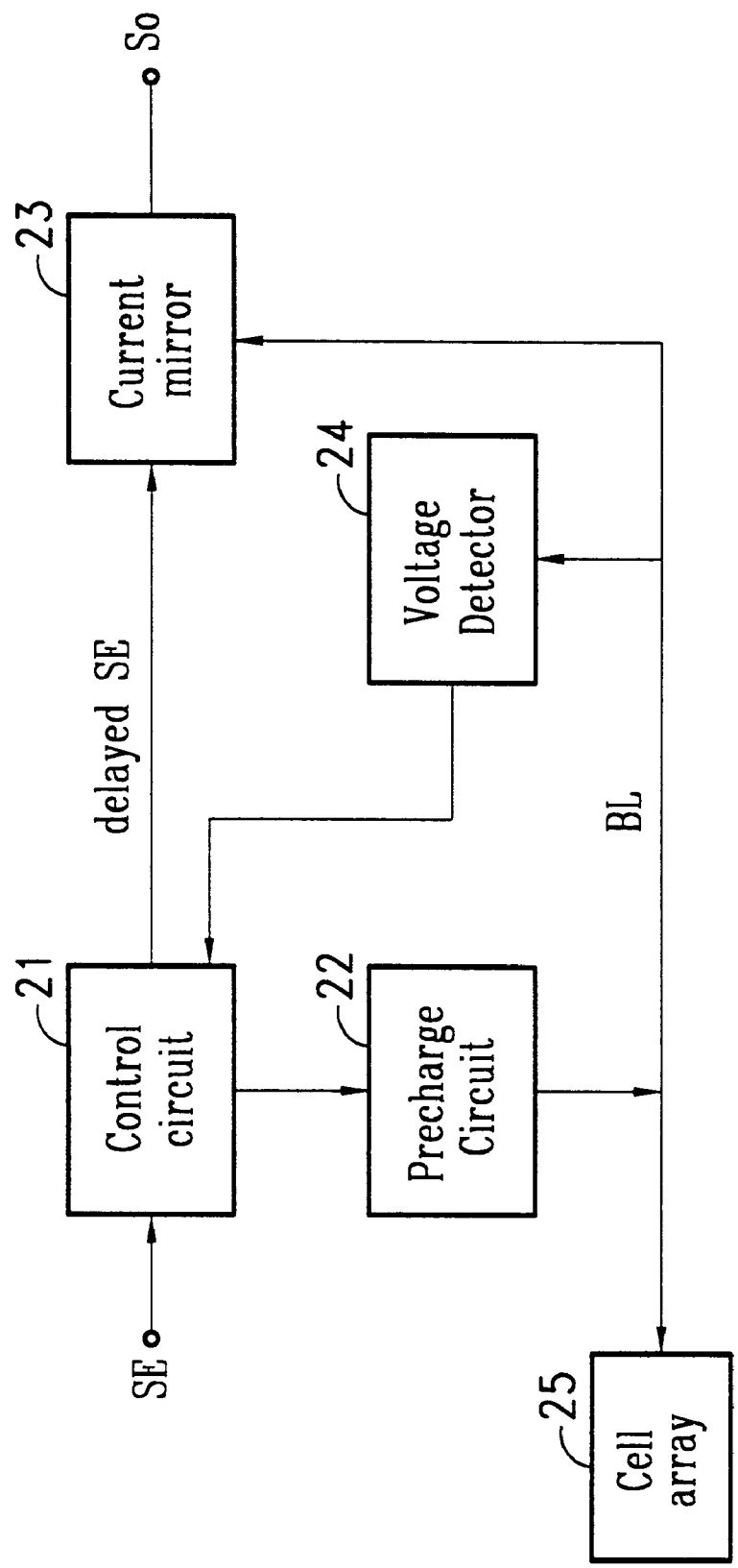
FIG. 2A demonstrates a block diagram of the current sensing circuit according to the present invention.

Referring to FIG. 2A, which shows a functional block diagram illustrative of the current sensing circuit according to the present invention. The circuit in the FIG. 2 basically encompasses a control circuit 21, a precharge circuit 22, a current mirror 23, a voltage detector 24, and a cell array 25. The sensing enable signal (SE) is directed into the control circuit 21, and a delayed SE is generated and routed to the precharge circuit, the current mirror 23. The voltage level detector 24 controls the control circuit 21 to generate a delayed SE. A cell array 25 connects with the precharge circuit 22, the current mirror 23, and the voltage detector 24 through BL. An output signal $S_o$ is obtained from the current mirror 23 after properly amplifying. Obviously, three additional circuits (the control circuit 21, the precharge circuit 22, and the voltage detector 24) are employed in the present invention, which is applied to precharge the voltage level of BL to an expected value before the read-cycle starts.

Figure 1B:
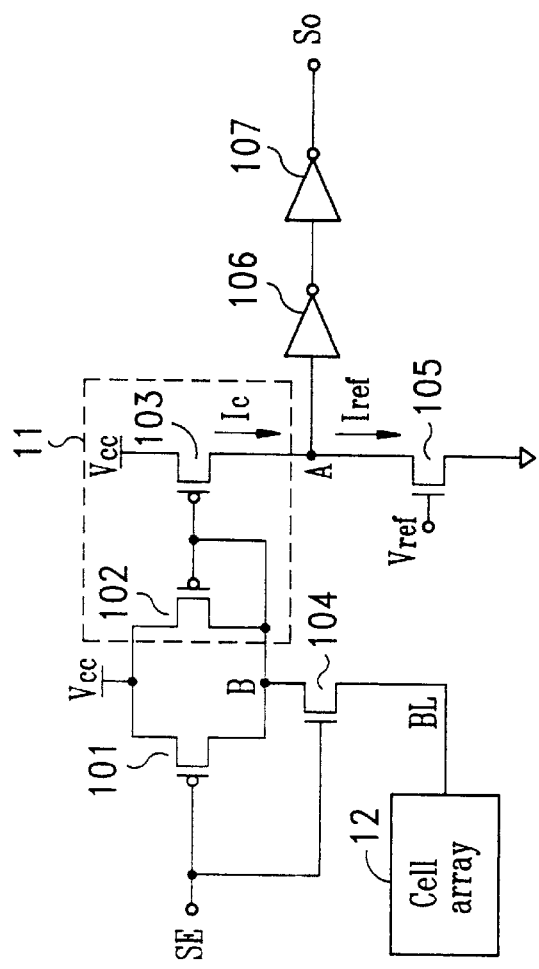
FIG. 1B is a detail diagram illustrative of the current sensing circuit in the FIG. 1A.
Figure 1A:
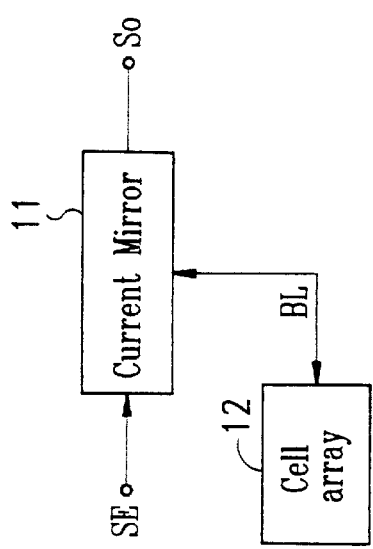
FIG. 1A represents a block diagram illustrative of a schematic structure of the conventional current sensing circuit.
Figure 2B:
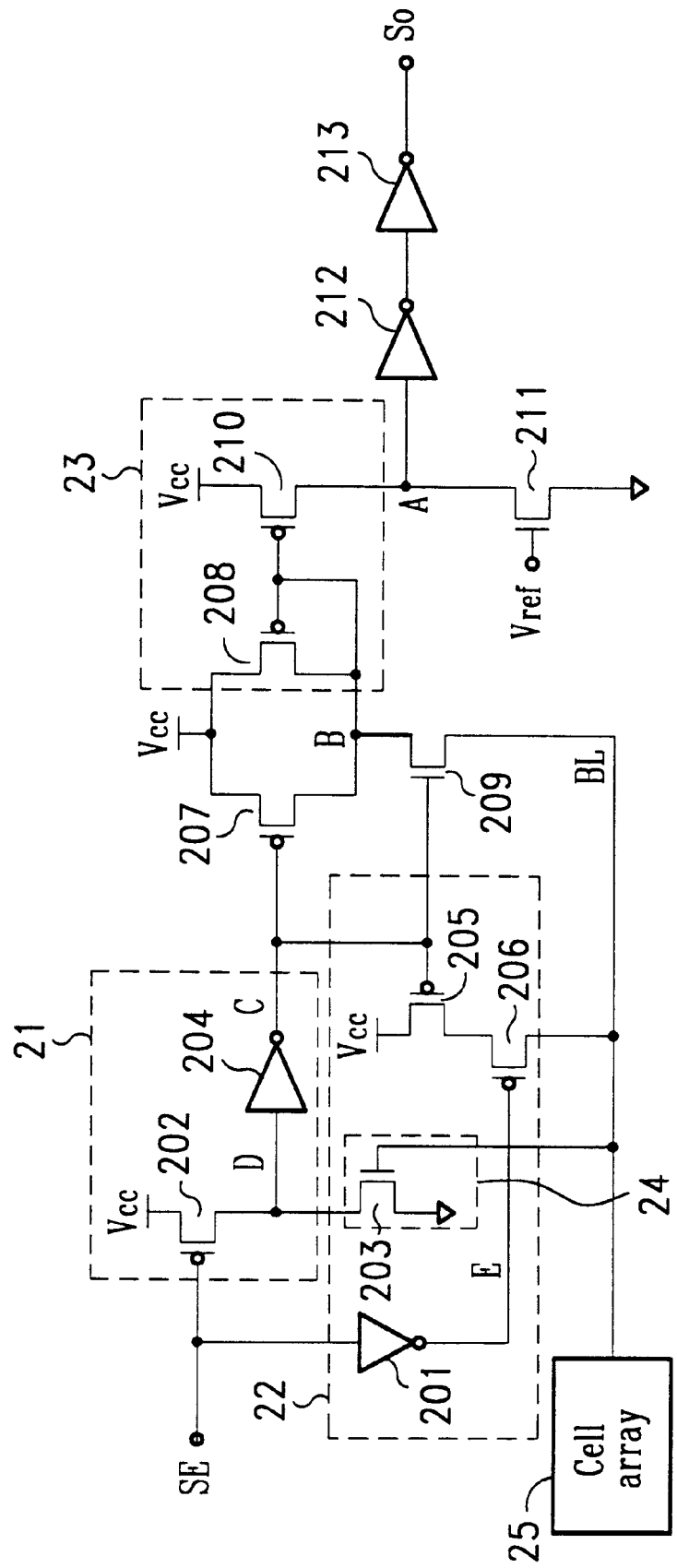
FIG. 2B shows a detail diagram illustrative of the current sensing circuit in the FIG. 2A.

Referring to FIG. 2B, which represents a detail diagram of the circuit in FIG. 2A. The construction of the current mirror 23 and the cell array 25 are the same as the counterpart of the circuit in FIG. 1B, such as two PMOS transistors 208 and 210 are used to establish the current mirror 23. Furthermore, a reference voltage $V_{ref}$ is used to generate a reference current through an NMOS transistor 211. In contrast with the circuit in FIG. 1B, the voltage detector 24 consisted of an NMOS transistor 203 detects the voltage level of BL. In addition, a PMOS transistor 207 is used to receive the delayed SE and routes it to the current mirror 23 (through the drain and gate of the PMOS 208) in the invention.

The control circuit 21 includes a PMOS transistor 202 and an inverter 204. The PMOS transistor 202 receives SE from its gate, and the input terminal of the inverter 204 is coupled with the drain of the PMOS transistor 202. The output terminal of the inverter 204 is further coupled with the gate of the PMOS transistor 207 and the precharge circuit 22. The precharge circuit 22 encompasses an inverter 201, and two series PMOS transistors 205 and 206. The input terminal of the inverter 201 is used to receive SE, and its output terminal is connected with the gate of the PMOS transistor 206. The drain of the PMOS transistor 206 is coupled with the BL. The drain of the NMOS transistor 203 is designed to connect with the drain of the PMOS transistor 202 and the input terminal of the inverter 204. The source of the NMOS transistor 203 is further connected with a voltage reference (usually connected with ground). The drain of the PMOS 205 and the source of the PMOS transistor 206 are coupled together, and the gate of the PMOS transistor 205 is connected with the output terminal of the inverter 204 and the gate of the NMOS transistor 209. A voltage reference (usually $V_{cc}$) is employed to support a stable voltage level at the source of the PMOS transistor 205. Finally, two series inverters 212 and 213 are applied for amplifying purpose before the output signal $S_o$ being output.

The operations of the circuit disclosed in the invention are given hereinafter by using the circuit diagram FIG. 2B. The voltage level of BL is reset to logic 0 before the read-cycle starts, and SE also remains at logic 0 this time. Based on the logic 0 at SE, the PMOS transistor 202 will be turned on, and the voltage levels of the nodes C and D become logic 1 and logic 0, respectively. Since the node C is changed to logic 0, the PMOS transistor 207 will be conducted, and thus pull up the voltage level of the node B to be logic 1. Both of the PMOS transistors 208 and 210 (i.e., current mirror 23) will be turned off.

At the beginning of the read-cycle, SE will be risen to logic 1 and thus turned off the PMOS transistor 202. Because the inverter 201 is used to invert the voltage level of SE, the inverted phase of SE will be logic 0 and thus conduct the PMOS transistor 206 at the same time. Furthermore, because BL remains at logic 0, the NMOS transistor 203 (i.e. the voltage detector 24) is turned off. Accordingly, the node D will be floating at logic 1, and the node keeps at logic 0. The current mirror 23 is also disabled because both the PMOS transistor 208 and 210 are off. The PMOS transistor 205 will be turned on at this moment, and a current will flow through the PMOS transistors 205 and 206 to BL for precharging. BL is keeping precharged until the BL's voltage level rises to an expected value. Please note that the size of the NMOS transistor 203 can be designed to control the quantity of the expected value. Obviously, the NMOS transistor 203 remains off until BL is precharged to the expected value. After the NMOS transistor 203 is conductive, the node D will be discharged to logic 0. The voltage level of the node C will be risen to logic 1. Then, both of the PMOS transistors 208 and 210 are turned on, and the node B will be pulled down to enable the current mirror 23. In comparison with the conventional circuit in FIG. 1B, the current sensing circuit in FIG. 2B remains disabled until the voltage level at BL is precharged to the expected value. Therefore, there will be no undesired output pulses appearing on $S_o$ at the beginning of the read-cycle.

Referring to FIG. 3B, which illustrates a waveform diagram representative the output pulses on $S_o$ when the circuit of FIG. 2B is applied. It is clear that there is no invalid output pulses whatever the logic-state of the memory cell is accessed. Moreover, the output pulses $S_o$ can be accessed at $t_1$ (but at $t_2$ conventionally), and thus decreases the access time of the current sensing circuit.

The operations of the read-cycle of the present invention are described hereinafter. When the read-cycle starts, SE will rise to logic 1. The voltage level of the node B will fall and the PMOS transistors 208 and 210 (i.e., the current mirror 23) will turn on. If the selected memory cell is not conductive, there will be no current flowing through the PMOS transistor 208 and the NMOS transistor 209. Accordingly, the voltage of the node A will be pulled down to logic 0, and the output $S_o$ is also logic 0. On the other hand, when the selected memory cell is conductive, there will be a significant current flowing through the PMOS transistor 208, the NMOS transistor 209 and BL into the selected memory cell. Because both the PMOS transistors 208 and 210 are conductive, a current with the same amount flowing through the PMOS transistor 208 will also appears at the node A. Then, the voltage level of the node A will be pulled up to be logic 1, and $S_o$ is also logic 1 after amplifying by two series inverters 212 and 213.

In conclusion, the present invention discloses a precharged circuit for reducing the access time delay of the current sensing circuit used in the flash memory device. Whole the current sensing circuit keeps disabled until the voltage level of the bit line is precharged to an expected value. The undesired output pulses is completely removed, and thus decreases the access time than the conventional skills.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A circuit of reducing access time for a current sensing circuit in a non-volatile memory, wherein said circuit comprises:

cell array means having a plurality of memory cells for storing programmed data of said non-volatile memory;

control means responsive to a sensing enable signal for generating a control signal and for delaying said sensing enable signal;

voltage detecting means connected to said control means for detecting a voltage level of a bit line that is coupled with said non-volatile memory;

precharging means responsive to said control signal and said delayed sensing enable signal for precharging said voltage level of said bit line; and output signal generating means responsive to said delayed sensing enable signal for generating an output signal when said voltage level of said bit line is precharged to a predetermined value.

2. The circuit according to claim 1, wherein said control means comprises:

a control MOS (Metal-Oxide-Semiconductor) transistor having a gate, a drain, and a source, said source of said control MOS transistor is coupled with a first reference voltage, said gate of said control MOS transistor receives said sensing enable signal, said drain of said control MOS transistor outputs said control signal; and a control inverter having an input terminal and an output terminal, said input terminal of said control inverter is coupled with said drain of said control MOS transistor, said output terminal of said control inverter outputs said delayed sensing enable signal.

3. The circuit according to claim 1, wherein said cell array means, said voltage detecting means, and said precharging means are coupled by using said bit line.

4. The circuit according to claim 1, wherein said voltage detecting means comprises a detecting MOS (Metal-Oxide-Semiconductor) transistor having a gate, a drain, and a source, said source of said detecting MOS transistor is coupled with a second reference voltage, said gate of said detecting MOS transistor is coupled with said bit line, said drain of said detecting MOS transistor is coupled with said control means.

5. The circuit according to claim 1, wherein said precharging means comprises:

a precharging inverter having an input terminal and an output terminal, said input terminal of said precharging inverter receives said sensing enable signal, said output terminal of said precharging inverter outputs said inverted phase of said sensing enable signal;

a first precharging MOS having a gate, a drain, and a source, said gate of said first precharging MOS transistor receives said delayed sensing enable signal, said source of said first precharging MOS transistor is coupled with a first reference voltage; and a second precharging MOS having a gate, a drain, and a source, said gate of said second precharging MOS transistor receives said inverted phase of said sensing enable signal, said drain of said second precharging MOS transistor is coupled with said bit line, said source of said second precharging MOS transistor is coupled with said drain of said first precharging MOS transistor.

6. The circuit according to claim 1, wherein said output signal generating means comprises:

a first mirror MOS transistor having a gate, a drain, and a source, said gate and said drain of said first mirror MOS transistor are coupled together to receive said delayed sensing enable signal, said source of said first mirror MOS transistor is coupled with a first voltage reference; and a second mirror MOS transistor having a gate, a drain, and a source, said gate of said second mirror MOS transistor is coupled together with said gate and said drain of said first mirror MOS transistor, said source of said second mirror MOS transistor is coupled with said first reference voltage, said drain of said second mirror MOS transistor outputs said output signal.

7. The circuit according to claim 6, wherein said output signal generating means comprises an amplifying means for amplifying said output signal.

8. A circuit of reducing access time for a current sensing circuit in a non-volatile memory, wherein said circuit comprises:

cell array means having a plurality of memory cells for storing programmed data of said non-volatile memory;

control means receives a sensing enable signal for delaying said sensing enable signal;

voltage detecting means coupled with said control means for detecting a voltage level of a bit line that is coupled with said non-volatile memory;

precharging means coupled with said control means and said voltage detecting means for precharging said voltage level of said bit line; and output signal generating means coupled with said cell array means, said voltage detecting means, said precharging means, and said output signal generating means for receiving said delayed sensing enable signal to generate an output signal when said voltage level of said bit line being precharged to a predetermined value.

9. The circuit according to claim 8, wherein said control means comprises:

a control MOS (Metal-Oxide-Semiconductor) transistor having a gate, a drain, and a source, said source of said control MOS transistor is coupled with a first reference voltage, said gate of said control MOS transistor receives said sensing enable signal, said drain of said control MOS transistor outputs said control signal; and a control inverter having an input terminal and an output terminal, said input terminal of said control inverter is coupled with said drain of said control MOS transistor, said output terminal of said control inverter outputs said delayed sensing enable signal.

10. The circuit according to claim 8, wherein said voltage detecting means comprises a detecting MOS (Metal-Oxide-Semiconductor) transistor having a gate, a drain, and a source, said source of said detecting MOS transistor is coupled with a second reference voltage, said gate of said detecting MOS transistor is coupled with said bit line, said drain of said detecting MOS transistor is coupled with said control means.

11. The circuit according to claim 8, wherein said precharging means comprises:

a precharging inverter having an input terminal and an output terminal, said input terminal of said precharging inverter receives said sensing enable signal, said output terminal of said precharging inverter outputs said inverted phase of said sensing enable signal;

a first precharging MOS having a gate, a drain, and a source, said gate of said first precharging MOS transistor receives said delayed sensing enable signal, said source of said first precharging MOS transistor is coupled with a first reference voltage; and a second precharging MOS having a gate, a drain, and a source, said gate of said second precharging MOS transistor receives said inverted phase of said sensing enable signal, said drain of said second precharging MOS transistor is coupled with said bit line, said source of said second precharging MOS transistor is coupled with said drain of said first precharging MOS transistor.

12. The circuit according to claim 9, wherein said output signal generating means comprises:

a first mirror MOS transistor having a gate, a drain, and a source, said gate and said drain of said first mirror MOS transistor are coupled together and responsive to said delayed sensing enable signal, said source of said first mirror MOS transistor is coupled with a first voltage reference; and a second mirror MOS transistor having a gate, a drain, and a source, said gate of said second mirror MOS transistor is coupled together with said gate and said drain of said first mirror MOS transistor, said source of said second mirror MOS transistor is coupled with said first reference voltage, said drain of said second mirror MOS transistor outputs said output signal.

13. The circuit according to claim 12, wherein said output signal generating means comprises an amplifying means for amplifying said output signal.

14. A method of reducing access time of a read-cycle for a current sensing circuit in a non-volatile memory having a plurality of memory cells that store programmed data, said method comprising said steps of:

inputting a sensing enable signal;

generating an inverted phase of said sensing enable signal;

delaying said sensing enable signal, said delayed sensing enable signal has a substantially same waveform as said waveform of said sensing enable signal;

precharging a voltage level of a bit line by using said inverted phase of said sensing enable signal and said delayed of said sensing enable signal; and generating an output signal according to a selected memory cell of said non-volatile memory when said voltage level of said bit line is precharged to a predetermined value.

15. The method according to claim 14, wherein said bit line is coupled with said memory cells of said non-volatile memory.

16. The method according to claim 14, wherein said output signal is amplified before outputting.

17. The method according to claim 14, wherein said current sensing circuit keeps disabled before said bit line is precharged to said predetermined value.

18. The method according to claim 17, wherein said current sensing circuit is enabled for generating said output signal when said bit line is precharged to said predetermined value.

19. The method according to claim 14, wherein said step of generating said output signal comprises a step of detecting said voltage level of said bit line before said output signal being generated.

20. The method according to claim 14, wherein said delayed sensing signal is generated by detecting a voltage level of said bit line.

* * * * *